CIRCUIT CONNECTORS PROVIDING IMPROVED ELECTRICAL CONTACT AND MECHANICAL RETENTION

Filed Oct. 29, 1963

INVENTORS
ROBERT W. JONES
RAYMOND J. BLANCHETTE
FORREST D. GROVES
BY Norman L. Chalfin
AGENT United States Patent Office 3,292,138
Patented Dec. 13, 1966

3,292,138

CIRCUIT CONNECTORS PROVIDING IMPROVED ELECTRICAL CONTACT AND MECHANICAL RETENTION

Robert W. Jones, Culver City, Calif. (15843 Kalisher St., Granada Hills, Calif.), Raymond J. Blanchette, 6858 Langdon Ave., Sherman Oaks, Calif., and Forrest D. Groves, 13921 Judd St., Pacoima, Calif.

Filed Oct. 29, 1963, Ser. No. 319,874
6 Claims. (Cl. 339—220)

This invention relates to circuit connection devices generally and more particularly to novel circuit connection means forming both component and wire connection terminals and wire and pin socket receptacles in a unitary device.

The circuit connection devices according to this invention provide both connection terminals and receptacles for miniature pin jacks and solid wire leads The devices may be used on circuit boards or cards, on circuit chassis and on circuit modules. Among the novel features of the invention are its unitary construction for both terminal and receptacle functions, an inwardly rolled groove and slotted end portion forming a bifurcated tip receptacle. The rolled-in groove forms a doughnut shaped intrusion into the inner, or receptacle portion of the terminal end of the invention which, together with the slot, provides a four-fold gripping action upon the wires or pins inserted therein to effect a better electrical contact and tighter holding upon such pins and wires than has heretofore been possible in miniature connection or socket receptacle devices of the prior art.

A further novel feature of an embodiment of the invention is that when used on a circuit board the entire connection can be made within the thickness of the circuit board.

The novel construction of the device of this invention is such that it may be inserted into circuit boards so as to provide a solid gripping action which mechanically joins the terminal and socket of this invention and the leads of any electrical components of the circuit to the board surface and makes a solid electrical connection thereto at the same time. One particular area of usefulness of the novel configuration of the terminal socket connection elements according to this invention is in advanced military, airborne or space instruments where high reliability must be achieved with rapid production assembly of the circuit boards therein. With circuit connection terminals according to this invention the production of electronic circuit chasses, welded or printed circuit cards and boards, or circuit modules may be accelerated in the assembly processes thereof because circuit connection terminal socket elements in accordance with the configurations disclosed herein may be assembled in an entire circuit board, card, or other circuit assembly without need for soldering or welding. For additional electrical reliability the circuit connection devices described herein may be soldered or welded, but such assembly practices are not absolutely necessary for the full and effective utilization of the invention.

Circuit terminal and socket elements according to this invention rigidly retain components of a circuit mechanically connected or wired thereto and provide heat-sink action when temperature-sensitive components are connected thereto.

The new terminal and socket elements comprise an upper receptacle portion having a bore to receive pin jacks or wire ends and an outer positioning and stopping flange. Below the flange the bore continues at reduced diameter to a terminal end. The terminal end near the extremity thereof has a concave roll about the periphery thereof forming an inner doughnut shaped intrusion into the terminal end of the bore. The terminal end is slotted centrally and longitudinally up to the flange forming thereby a bifurcated tip and making out of the sharp edges of the portion of the slot, at the doughnut shaped intrusion, a cutting or biting transition of each such edge thus providing four sharp gripping and contacting edges or surfaces to tightly hold and make an efficient electrical contact between the terminal receptacle end and any pin or wire inserted therein.

The upper receptacle portion of the terminal and socket receptacle of this invention is insertable into pre-drilled or punched holes in a circuit board, being stopped by the flange, and the upper end may be flared, rolled or riveted over to make tight mechanical and electrical contact with the circuit board or component lead or lug that may be attached thereto. In some embodiments of the invention a separate ferrule terminal turret is used to receive the socket portion. The lug may form a soldering terminal for wires or component leads, or a contact for assembly to other boards with receptacle sockets positioned in mating relation thereto, by insertion of the terminal end into said sockets. Alternatively the terminal and socket receptacle may receive in its upper receptacle portion wire leads or pins which when inserted therein are firmly gripped by the abovementioned four gripping edges formed by the bifurcated and intruded inner surfaces thereof.

For use with metallic chassis assemblies or circuit plates a high impact thermosetting plastic or other insulative bushing may be provided for the terminal and socket receptacle of the invention.

Accordingly it is an object of this invention to provide a multipurpose terminal receptacle for electrical circuit connection boards having an upper reecptacle adapted for flaring or rolling as in a rivet, a stopping flange and a lower terminal portion in which the bore of the receptacle portion continues to a novel rolled intrusion about the periphery thereof, the rolled intrusion and lower terminal portion being slotted to form a bifurcated tip in which the inner edges of the intrusion within the slot form four tight gripping and contacting surfaces for pin or wire plug elements inserted therein.

It is a further object of this invention to provide a novel multipurpose terminal receptacle element for circuit boards which has improved contact and electrical connection capabilities and may be more efficiently and rapidly assembled to such circuit boards and effect better and more rigid component retention.

It is another object of this invention to provide an electrical circuit connection terminal for single circuit use as both a wire and component connection terminal and a pin or wire connection receptacle.

It is a still further object of this invention to provide a novel circuit connection element which may be readily inserted in a circuit board and provide a pin jack or terminal for wiring of components or leads thereto.

It is still another object of this invention to provide novel circuit boards force-fitted insert devices which are usable in a plurality of ways as pin jacks or terminal connectors for circuit components.

It is an even further object of the invention to provide a circuit connection device with a novel contact receptacle means having bifurcated and rolled end portions which make more positive contact with small pin connection elements than has heretofore been possible in miniature devices of the prior art.

It is yet another object of this invention to provide a circuit connection element insertable in circuit boards for wiring interconnection with circuit elements of said board and having an improved slotted and bifurcated rolled end portion which operates as a spring retaining receptacle for miniature circuit connection pin plugs.

It is yet a further object of this invention to provide a novel circuit connection terminal device wherein by a novel combination of a rolled inward end portion and a bifurcating slot therein a tight four point contact can be made with any miniature pin to provide exceptionally good electrical connection under extremes of vibration and other environmental hazards.

It is still another object to provide in a miniature pin jack a novel combination of slot and inward rolling construction which makes a more positive, vibration resistant electrical contact with greater holding power, and a ferrule or turret contact terminal to receive the receptacle.

These and other objects of the invention may be seen more clearly from the description which follows taken together with the appended claims and the accompanying drawings in which several representative embodiments are shown illustrating some of the forms which the invention may take. It is to be clearly understood that other forms of the invention within the spirit and scope of the claims may occur to those skilled in the arts to which this invention is applicable.

Figure 10:
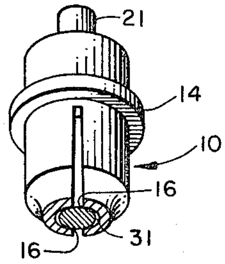
Figure 1:
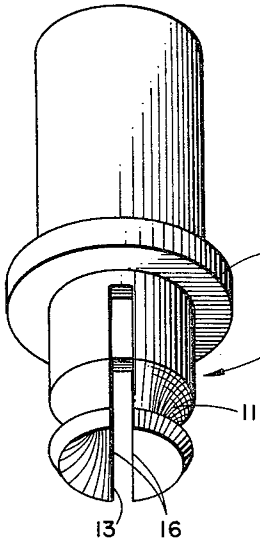
FIGURE 1 is a perspective view of the invention very much enlarged and looking at the receptacle end thereof, showing features of the new terminal connection and receptacle.
Figure 2:
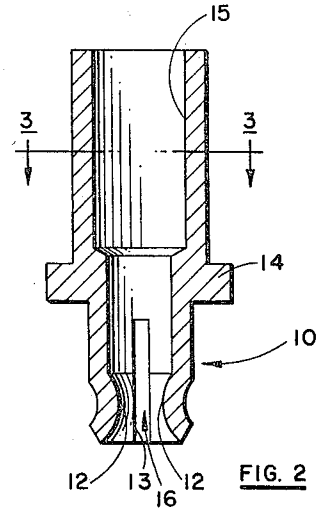
FIGURE 2 is a cross section longitudinally through the article shown in FIGURE 1, revealing details of the inner construction thereof.
Figure 9A:
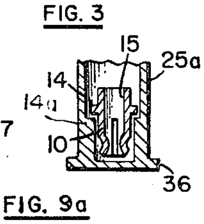
Figure 5:
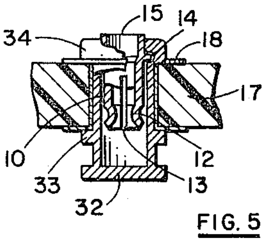
FIGURE 5 is a partially cross sectional view of another embodiment of the invention as a receptacle and lug combination showing an alternative capping means therefor and including an external sleeve terminal element otherwise in contact with the receptacle portion thereof.
Figure 9B:
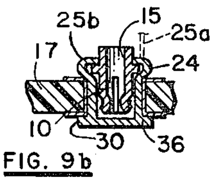
Figure 6:
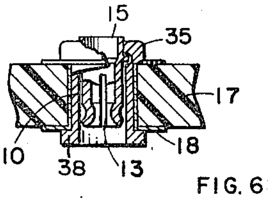
FIGURE 6 is a partially cross sectional view of a further embodiment of the incorporating modifications particularly suited to printed circuit board use.

FIGURES 9*a* and 9*b* are partially cross-sectional details of the article shown in FIGURES 5 and 6 to illustrate features thereof; and FIGURE 10 is a partially sectional detail of the article shown in FIGURES 1 and 2 showing features thereof.

Figure 3:
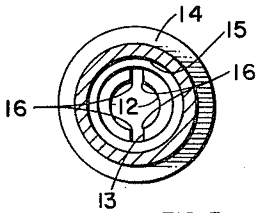
FIGURE 3 is a top view through 3—3 of the article in FIGURE 2, the top portion being cut away so as to provide a closer view looking into the receptacle portion of the article according to this invention.
Figure 8:
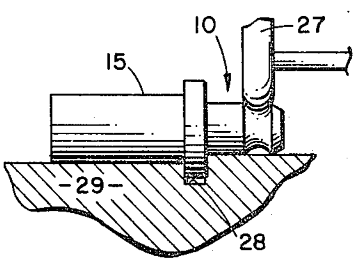
FIGURE 8 illustrates a method by which a component of the invention may be accomplished.

Referring now to FIGURES 1, 2 and 3 taken together wherein a representative example of the invention is shown in greatly enlarged perspective, the example may be seen to include a lug receptacle 10 of generally tubular configuration having a circular self extension or flange 14 thereabove and having therein an inwardly rolled depression 11 near the end of said lug receptacle 10. The lug receptacle 10 is bifurcated by slot 13 forming two resilient ends 16 which may be seen in FIGURE 2 to form intrusions 12 within lug receptacle 10. The inner intrusions 12 are in fact accomplished prior to bifurcation (by slot 13) being rolled into the tubular portion of lug 10 as shown in FIGURE 8 by a preshaped tool 27.

Figure 4:
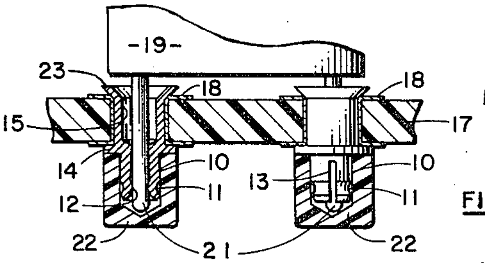
FIGURE 4 is a representative use illustration of a plug receptacle embodiment of the article shown in FIGURES 1–3, the embodiment hereof being shown partly in cross-section inserted in a typical circuit board; and incorporating additional details thereof.
Figure 7:
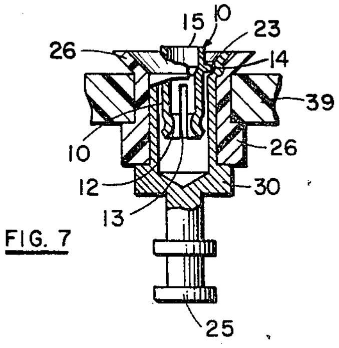
FIGURE 7 is a partially cross-sectional view of a still further embodiment of the invention incorporating further modifications for particular uses thereof.

Above flange 14 the article includes a rivet tube 15 which may be used in many ways to secure the article to a terminal board or circuit board 17. In FIGURE 4 the end 15 may be seen to have been flared as at 23. In FIGURES 5 and 6 the end 15 is inserted in ferrule turrets 32 and 38 which is rolled, folded or peened over to form caps 34 and 35, all respectively. This is further described below. In FIGURE 7 the flare 23 previously mentioned in connection with FIGURE 4 is shown to be fitted into an insulating bushing 26 with a matching flare for insertion in a metal panel or chassis 20. The configuration shown in FIGURE 7 is designed to be used with metal panel or chassis assemblies. The insulating bushing 26 may be made of a cold flowing insulative plastic material such as "Teflon" for electrical insulation of the terminal receptacle from the chassis or panel 20.

The ferrule terminal 25 of FIGURE 7 is similar in form to that shown in FIGURE 4 but terminal 25 is somewhat elongated. At 30 the stopping flange portion of ferrule terminal 25 may be seen. In FIGURE 7 the insulative bushing 26, the end ferrule 23 are flared together to maintain the assembly of the turret and socket inserted in a panel as to 39. The flare at 23–26 of FIGURE 7 pulls flange 30 up toward panel 39 effecting the tight fit.

FIGURES 9*a* and 9*b* are illustrations relating to another embodiment of the invention involving a ferrule turret 36 similar to turrets 32, 38 and 25, respectively, of FIGURES 5, 6 and 7. In FIGURE 9*a*, a lug receptacle 10 is shown disposed in ferrule turret 36 with flange 14 resting on a ledge 14 of ferrule turret 36. Portion **25*a* is rolled over a peened to form cap 25*b*** as shown in FIGURE 9*b*.

In FIGURE 4, a detail is shown of the use of an embodiment of the invention as a socket terminal for the pins 21 of a device 19 such as a transistor, a vacuum tube or a quartz crystal oscillator assembly.

Referring now further to FIGURE 4, insulative preformed caps 22 are shown inserted over lugs 10 so as to protect lugs 10 from coming into contact with other circuit elements below or, when the circuit board 17 should be in a dip soldering operation, insulative caps 22 will prevent solder from entering upon lug 10 and possibly filling slot 13 and the receptacle 15. The receptacle 15 can be seen to be flared at 23 over circuit trace elements 18 on circuit board 17 making electrical contact of receptacle 15 and its communicating lug portion 10 with circuit trace elements 18. Flange 14 and flared portions 23 are compressed toward one another across circuit trace element 18 on board 17 so as to effect good electrical contact.

If reference is now made again to FIGURES 5, 6, and 9*b*, it can be seen that the folded-over portions 34, 35 and **25*b* of their respective ferrule turrets pull the lower flange (see 33 in FIG. 5) of each ferrule turret up against circuit trace elements 18 on board 17** in the same manner as above described in connection with FIGURE 4. In FIGURES 5, 6 and 9*b* electrical contact is made similarly to that shown in FIGURE 4. However in FIGURES 5, 6, 9*a* and 9*b* lug 10 is protected with ferrule turrets 32, 38 and 36 which with its turret elements provides external electrical connection means for wires and circuit component leads.

A particular feature of the invention herein is illustrated in FIGURE 10. A pin 21 is shown in FIGURE 10 inserted into a lug 10 in the manner more fully illustrated in FIGURE 4. Referring to FIGURE 10 it may be seen that pin 21 and lug 10 are cut away at 31 at the points 16 in the intrusion 11 into lug 10 where the constriction (12 of FIGURE 2) and the discontinuity in the intrusion 11, formed by slot 13, bite upon pin 21 to make a good electrical contact thereon. It has been observed in the fabrication of pin connection terminal socket elements according to the above described invention that on the first insertion of a pin such as 21 into receptacle 15 when the pin 21 comes in contact with the discontinuity portions 16 of slot 13 in intrusion 12, any burrs which would be expected to be left from the operation of cutting slot 13 are forced off and the receptacle portion at 12 is formed to fit pin 21. The discontinuity edges 16 (FIGURE 3) bite tightly on pin 21. This results in part from the fact that, as would be excepted following the slotting operating to make slot 13, there is a resilient tendency of the remainder of lug 10 at slot 13 to be urged inwardly so that pin 21, being inserted, tends to act against the resilient urge, further enhancing the contact between lug 10 at 12 and pin 21.

In FIGURE 8 as previously mentioned a representative illustration is given of a technique which may be used to form the intrusion 11 in lug 10. The device of this invention is best manufactured on screw machine types of lathes, but other means may be employed. As one means of so doing the material used would be a continuous rod stock in which the part 15 is first turned on the lathe followed by the part 10. Prior to cutting off the almost complete part (groove 13 has not yet been cut) a tool such as 27 is forced against part 10 to form intrusion 11–12 (FIGURES 1, 2, and 10), while the part turns in the lathe. A preformed support 29, 28 is used to take up the pressure of tool 27. Following the above described operation a saw is used to cut slot 13 longitudinally along the axis of the part 10.

There has been described above a novel pin connection device 10 which may be inserted in circuit board with circuit trace elements such as 18 thereon. The pin connection device connects to the trace elements to receive pin or wire connectors. The pin connections 10 are described in several embodiments to show that there are many ways in which the slotted tip end 10 having an intrusion 11–12 into the central aperture thereof is thereby formed into a tightly contacting electrical circuit receptacle for such pins wherein the discontinuity 16 formed by the slot 13 in the intrusion 11 rolled around the tip makes four biting edges 16 which, as shown for pin 21 in FIGURES 2 and 4 and FIGURE 10, tightly grip pin 21, making a good electrical contact therewith. The pin connection devices such as shown at 10 in FIGURES 1, 2, and 10, herein described may be used within and in combination with insulative sleeves in metallic circuit modules or assemblies, or in combination with ferrule and turret elements such as 25 or 32, or 36 by inserting the pin connection receptacle 10 with the slotted tip 13 and annular intrusion 11, 12 into the ferrule and closing over the top of the ferrule upon the pin connection element such as indicated at 24 in FIGURE 9*b* and 34, 35 in FIGURES 5 and 6 to form a neat, tight, pin receptacle. Wen used as shown in FIGURES 6 and 9 it can be clearly seen that the entire assembly can be made no thicker than the board in which it is inserted. In some applications of devices used according to the above described invention the thickness of board is no more than 3/32 of an inch. Even thinner boards have been used and parts according to this invention fitted therein with little or no projection above and below the surface of the board.

What is claimed as new is:

1. An electrical connection socket terminal device for insertion into circuit boards comprising:

a generally cylindrical upper portion of predetermined diameter having a central receiving bore therein;

a lower socket portion in axial alignment with said generally cylindrical upper portion, said lower portion being smaller in diameter than said upper portion and having therein a bore of reduced diameter with respect to said central receiving bore, said bore of reduced diameter in said lower portion continuing from and being in communication with said central receiving bore, the outer diameter of said lower portion having a rolled-in groove therein near the lowermost end thereof;

a stopping flange extending from the lower end of said upper portion and the upper end of said lower portion about the outer diameter of said socket terminal device for limiting the depth to which said device may be inserted into circuit boards; and said lowermost end being slotted axially through said rolled-in groove to form a bifurcated gripping tip in said lower socket portion with said rolled-in groove therearound forming a doughnut-shaped intrusion into said bore of reduced diameter, the discontinuities of said intrusion due to the bifurcation thereof forming gripping edges so that when said device is in a circuit and an electrical circuit connection pin or wire end is inserted through said receiving bore into said bore of reduced diameter, said intrusion discontinuities make a binding tight electrical contact with said pin or said wire end.

2. The electrical connection socket terminal device defined in claim 1 inserted in a lead trace circuit board with trace connection apertures wherein the top of said generally cylindrical upper portion is flared outwardly so that when said upper portion of said device is inserted into a trace connection aperture said outwardly flared end and said flange are pressed toward one another against said lead trace connection about the periphery of said lead trace connection aperture to hold said device tightly in said circuit board and make good electrical contact with said lead trace.

3. The electrical connection socket terminal device defined in claim 1 in combination with an insulative bushing over the outer diameter of said generally cylindrical upper portion down to said flange, wherein the top of said generally cylindrical portion is flared outwardly after said device with its outer insulative bushing has been inserted in a metallic circuit assembly, said insulative sleeve electrically insulates said device from said metallic circuit assembly and said flared end and said flange are compressed toward one another to make a tight fit of said device in said circuit assembly.

4. A socket assembly for receiving connection wires or pins, said assembly comprising:

a turret terminal ferrule having a wire connection terminal end and a ferrule end opposite, the connection terminal end having a flange to limit the depth of insertion thereof into circuit assemblies, the ferrule end being normally open to receive a socket and having therein an upper bore and a lower bore smaller in diameter than said upper bore and communicating therewith, the transition from said lower bore to said upper bore forming a ledge therein;

a circuit assembly board being foraminate to receive turret ferrule devices in the foramina thereof the ferrule devices adapted to receive and hold socket receptacle devices; and device including a generally cylindrical upper socket portion of predetermined diameter having a central receiving bore therein; a lower socket portion in axial alignment with said generally cylindrical upper portion and having a bore therein of reduced diameter in communication with said receiving bore, a stopping flange being formed about the transition from said lower end of said upper portion to the upper end of said lower portion on the outer diameter of said socket terminal device, and a bifurcated gripping tip formed by the lower end of said lower socket portion and having therearound a doughnut-shaped intrusion into said bore of reduced diameter, the discontinuities of said bifurcated intrusion forming gripping edges to make a tightly binding electrical contact with said pins or said wires inserted through said receiving bore into said bore of reduced diameter, said electrical circuit connection terminal being inserted and tightly fitted into said ferrule end of said turret terminal ferrule wherein said flange of said electrical circuit connection terminal and socket device sits upon said ledge in said ferrule and said receptacle means of said electrical circuit connection terminal and socket device is flared concentrically with said open end of said ferrule end whereby said socket assembly board is tightly fitted into said circuit assembly boards, so that said electrical circuit connection terminal and socket receptacle device receives said wire and pin connections inserted therein and said terminal end of said turret terminal ferrule may have wire connection elements or other wires soldered thereto.

5. A socket assembly for receiving connection wires or pins, said assembly comprising:

a turret terminal ferrule having a wire connection terminal end and a ferrule end opposite, the connection terminal end having a flange to limit the depth of insertion thereof into circuit assemblies, the ferrule end being normally open to receive a socket and having therein an upper bore and a lower bore smaller in diameter than said upper bore and communicating therewith, the transition from said lower bore to said upper bore forming a ledge therein;

an insulative sleeve about said ferrule end of said turret terminal above said flange;

a circuit assembly board including foraminae adapted to receive turret terminal ferrules, said ferrules including and adapted to hold socket receptacle devices; and an electrical circuit connection terminal and socket receptacle device including a generally cylindrical upper socket portion of predetermined diameter having a central receiving bore therein, a lower socket portion in axial alignment with said generally cylindrical upper portion and having a bore therein of reduced diameter in communication with said receiving bore, a stopping flange being formed about the transition from said lower end of said upper portion to the upper end of said lower portion on the outer diameter of said socket terminal device, and a bifurcated gripping tip formed by the lower end of said lower socket portion and having therearound a doughnut-shaped intrusion into said bore of reduced diameter, the discontinuities of said bifurcated intrusion forming gripping edges to make a tightly binding electrical contact with said pins or said wires inserted through said receiving bore into said bore of reduced diameter, said electrical circuit connection terminal being inserted and tightly fitted into said ferrule end of said turret terminal ferrule wherein said flange of said electrical circuit connection terminal and socket device sits upon said ledge in said ferrule and said receptacle means of said electrical circuit connection terminal and socket device is flared concentrically with said open end of said ferrule end and said insulative sleeve whereby when said socket assembly is tightly fitted into said circuit assembly board of metallic character thereby to insulate said socket assembly from said circuit assembly board of metallic character.

6. A multipurpose terminal and socket receptacle device for circuit trace board assemblies, said device comprising:

a soldering terminal ferrule having a central bore therein extending a predetermined distance into said ferrule forming a rollable or flarable tube at one end thereof and having a soldering turret for wire connections at the opposite end thereof, said soldering turret end of said ferrule including at least one flange member to act as a stopping element for insertion of said ferrule into a circuit trace board, the central bore of said ferrule having a ledge therein; and a socket receptacle being inserted into said central bore of said ferrule, said socket receptacle including a generally cylindrical upper portion of predetermined diameter having a central receiving bore therein, a lower socket portion in axial alinement with said upper portion and being of smaller diameter than said upper portion and having a bore of reduced diameter therein communicating with said central receiving bore, a flange being in a location about the outer periphery of said socket receptacle between said upper and lower portions thereof, said flange being seated on said ledge in said ferrule, said flarable or rollable tube being flared or rolled over the flange on the outer surface of said socket receptacle holding it tightly on said ledge of said central bore of said ferrule, and when said terminal and socket receptacle device thus assembled is inserted in a circuit trace board the roll or flare of said ferrule forms one limiting end and the one flange member of said ferrule forms the other limiting end to tightly bind said terminal and socket receptacle device to the circuit trace board making a good electrical bond with circuit trace elements thereon.

References Cited by the Examiner

UNITED STATES PATENTS

| | | | |
|---|---|---|---|
| 1,906,469 | 5/1933 | Knutson | 339—220 X |
| 2,295,266 | 9/1942 | Obszarny | 339—95 |
| 2,386,171 | 10/1945 | Wild | 339—220 |
| 2,689,337 | 9/1954 | Burtt et al. | 339—217 |
| 2,796,593 | 6/1957 | Offerman | 330—220 |
| 2,814,024 | 11/1957 | Narozny | 330—220 X |
| 2,924,008 | 2/1960 | Field | 339—217 X |
| 2,931,008 | 3/1960 | Abrams | 339—220 X |
| 2,948,773 | 8/1960 | Hawes | 339—220 X |
| 2,979,689 | 4/1961 | Jackson et al. | 339—217 |
| 2,992,403 | 3/1962 | Hawk | 339—17 X |
| 3,026,496 | 3/1962 | Gluck | 339—193 |

FOREIGN PATENTS

| | | |
|---|---|---|
| 888,744 | 2/1962 | Great Britain. |

EDWARD C. ALLEN, *Primary Examiner.*

PATRICK A. CLIFFORD, *Examiner.*